(12) United States Patent
Sawata

(10) Patent No.: US 11,022,587 B2
(45) Date of Patent: Jun. 1, 2021

(54) ELECTRIC CONDUCTIVITY DETECTOR AND METHOD FOR DETERMINING PHASE ADJUSTMENT VALUE

(71) Applicant: SHIMADZU CORPORATION, Kyoto (JP)

(72) Inventor: Hideto Sawata, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 16/621,645

(22) PCT Filed: Jul. 7, 2017

(86) PCT No.: PCT/JP2017/024965
§ 371 (c)(1),
(2) Date: Dec. 11, 2019

(87) PCT Pub. No.: WO2019/008743
PCT Pub. Date: Jan. 10, 2019

(65) Prior Publication Data
US 2020/0209202 A1 Jul. 2, 2020

(51) Int. Cl.
*G01R 27/22* (2006.01)
*G01N 30/64* (2006.01)
(Continued)

(52) U.S. Cl.
CPC .............. *G01N 30/64* (2013.01); *G01N 30/60* (2013.01); *G01R 27/22* (2013.01); *H03G 3/30* (2013.01)

(58) Field of Classification Search
None
See application file for complete search history.

(56) References Cited

U.S. PATENT DOCUMENTS 4,227,151 A * 10/1980 Ellis ................ G01N 27/07
324/448
5,138,264 A * 8/1992 Seki ................ G01N 27/06
324/439
(Continued)

FOREIGN PATENT DOCUMENTS

JP  H03-72368 U   7/1991
JP  H04-29048 A   1/1992
(Continued)

OTHER PUBLICATIONS

Decision of Rejection for corresponding Taiwanese Application No. 107123276, dated Jan. 16, 2020, with English language translation.
(Continued)

*Primary Examiner* — Jermele M Hollington
(74) *Attorney, Agent, or Firm* — Renner, Otto, Boisselle & Sklar, LLP

(57) ABSTRACT

An electrical conductivity detector includes a cell, a pair of electrodes, a voltage application part, an amplification circuit, a phase adjustment value holding part, and a signal processing circuit. The amplification circuit has multiple gains, and amplifies a current flowing between the pair of electrodes using any one of the gains to obtain an amplified signal. The phase adjustment value holding part holds a phase adjustment value determined in advance for each of the gains for canceling a phase difference between amplified signals determined using each of the gains of the amplification circuit. The signal processing circuit calculates electrical conductivity of the liquid flowing through the cell using an amplified signal obtained by being amplified by the amplification circuit and the phase adjustment value which is for the gain used to obtain the amplified signal and is held in the phase adjustment value holding part.

7 Claims, 4 Drawing Sheets

(51) Int. Cl.
*G01N 30/60* (2006.01)
*H03G 3/30* (2006.01)

(56) References Cited

U.S. PATENT DOCUMENTS

| | | | | |
|---|---|---|---|---|
| 9,835,573 | B2* | 12/2017 | Herb | G01N 27/028 |
| 10,473,498 | B2* | 11/2019 | Momose | G01F 1/60 |
| 2002/0137488 | A1 | 9/2002 | Mitama | |
| 2015/0002178 | A1* | 1/2015 | Herb | G01N 27/02 |
| | | | | 324/693 |
| 2015/0097588 | A1* | 4/2015 | Kim | G01N 27/046 |
| | | | | 324/693 |
| 2017/0261357 | A1* | 9/2017 | Wang | G01F 1/584 |
| 2019/0369066 | A1* | 12/2019 | Sawata | G01N 30/64 |
| 2021/0055242 | A1* | 2/2021 | Sawata | G01R 27/22 |

FOREIGN PATENT DOCUMENTS

| | | |
|---|---|---|
| JP | H07-072192 A | 3/1995 |
| JP | H10-022752 A | 1/1998 |
| JP | H11-281687 A | 10/1999 |
| JP | H11-304856 A | 11/1999 |
| JP | 2002-005971 A | 1/2002 |
| JP | 2002-290254 A | 10/2002 |

OTHER PUBLICATIONS

International Search Report for corresponding Application No. PCT/JP2017/024965, dated Oct. 3, 2017.
International Written Opinion for corresponding Application No. PCT/JP2017/024965, dated Oct. 3, 2017.
Office Action for corresponding Taiwanese Application No. 107123276, dated Oct. 5, 2019.
Office Action for corresponding Taiwan Patent Application No. 10921120420 dated Nov. 19, 2020, with English language translation.
Office Action for corresponding Japanese Patent Application No. 2019-528302 dated Oct. 6, 2020, with English language translation.

* cited by examiner

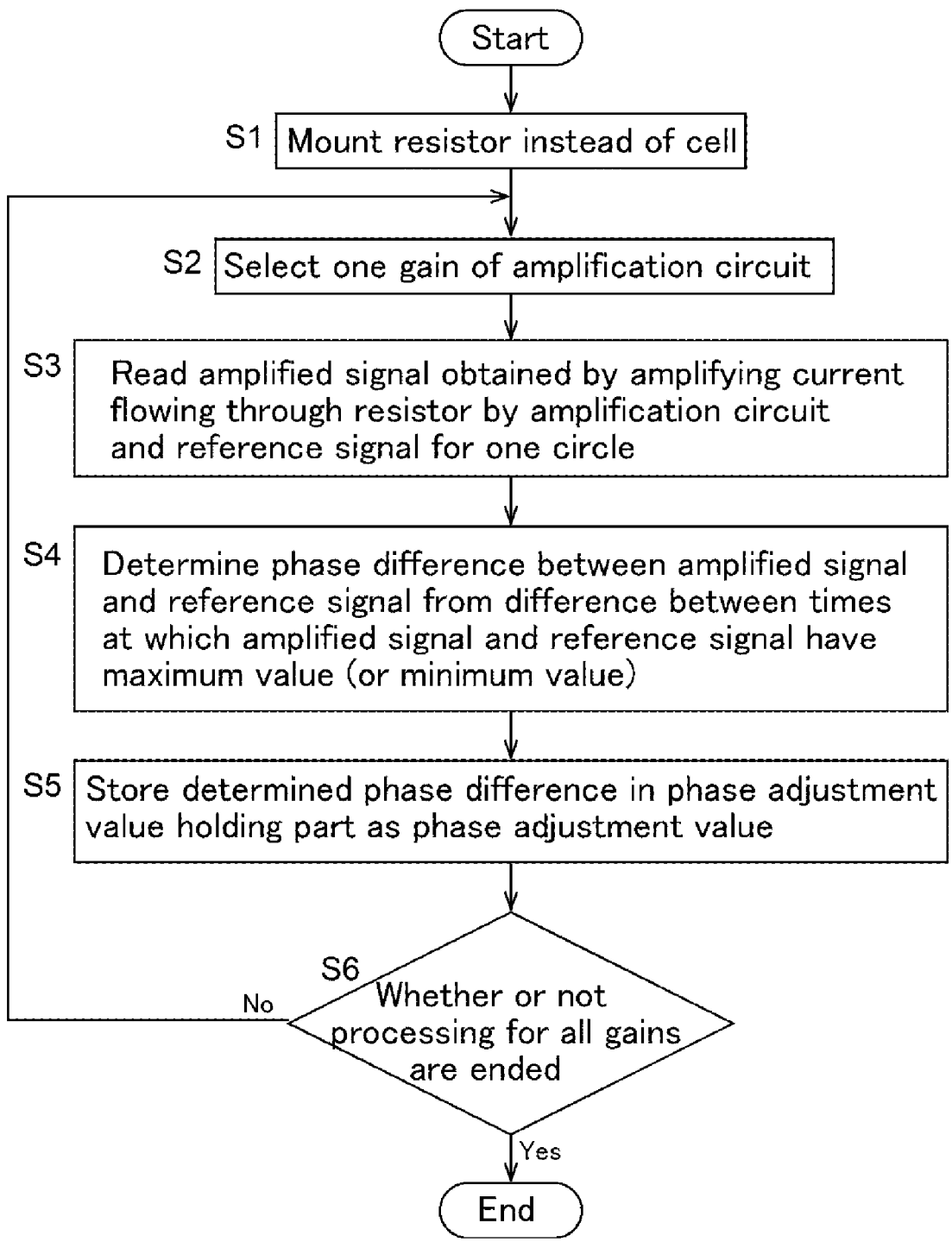

ELECTRIC CONDUCTIVITY DETECTOR AND METHOD FOR DETERMINING PHASE ADJUSTMENT VALUE

TECHNICAL FIELD

The present invention relates to an electrical conductivity detector used, for example, for detection of a sample component in ion chromatography, and a method for determining a phase adjustment value used for phase adjustment in the electrical conductivity detector.

BACKGROUND ART

An electrical conductivity detector (also referred to as a conductivity meter or a conductivity sensor) immerses a pair of electrodes in a sample liquid flowing through a cell, applies a voltage between these electrodes, and detects a change of the magnitude of a current flowing between the electrodes as a change in the electrical conductivity of the sample liquid.

In the electrical conductivity detector, the electrical conductivity is determined using an amplified signal obtained by amplifying a current value flowing between the electrodes by an amplification circuit. If the gain (amplification factor) of the amplification circuit is large, small changes in a current can be detected with high sensitivity so that resolution is improved, whereas the upper limit of detectable electrical conductivity is lowered, and the detection range is narrowed. On the contrary, when the gain of the amplification circuit is small, the detection sensitivity is lowered, but the upper limit of the detectable electrical conductivity is also increased, and the detection range is widened.

Thus, the detection sensitivity (or resolution) and the detection range are in a trade-off relationship. Therefore, in a case where the variation of the electric conductivity of the sample liquid is large, when the electric conductivity is detected by amplifying the current using only one gain in the amplification circuit, there is a problem that the electric conductivity of the sample liquid exceeds the upper limit of the detectable electric conductivity or the detection sensitivity is insufficient.

Therefore, if the gain of the amplification circuit is only one, it is impossible to achieve both measurement of the electric conductivity over a wide range and detection with high resolution. In view of such a problem, changing the gain of the amplification circuit as necessary has been conventionally performed (see, for example, Patent Document 1).

PRIOR ART DOCUMENT

Patent Document

Patent Document 1: Japanese Patent Application Laid-Open No. 11-281687

SUMMARY OF THE INVENTION

Problems to be Solved by the Invention

If the gain of the amplification circuit is changed during the measurement, the waveform of the electric conductivity may be disturbed and discontinuous before and after the switching of the gain.

An object of the present invention is to suppress disturbance of a waveform caused by switching of a gain of an amplification circuit in an electrical conductivity detector.

Solutions to the Problems

The present inventor has found that the cause of the disturbance of the waveform of the electric conductivity before and after the switching of the gain of the amplification circuit is that the phase delay amounts generated in the circuits constituting respective gains of the amplification circuit are different from each other, and therefore, the phase of the current amplified using the gain and the phase of the current amplified using another gain are shifted from each other. Then, the present inventor came to the idea that, if the phase delay amounts generated in the circuits constituting respective gains of the amplification circuit are examined in advance, the phases of the currents amplified using the respective gains can be adjusted to be the same using the delay amounts. The present invention has been made based on such a finding.

The electrical conductivity detector according to the present invention includes a cell, a pair of electrodes, a voltage application part, an amplification circuit, a phase adjustment value holding part, and a signal processing circuit. A sample liquid flows through the cell. The pair of electrodes are immersed in the liquid flowing through the cell, and a predetermined voltage is applied between the pair of electrodes by the voltage application part. The amplification circuit has a plurality of gains, and is configured to amplify a current flowing between the pair of electrodes using any one of the gains to obtain an amplified signal. The phase adjustment value holding part is configured to hold phase adjustment values determined in advance for each of the gains for canceling a phase difference between amplified signals obtained using each of the gains of the amplification circuit. The phase adjustment value is, for example, a phase delay amount generated in a circuit including each gain circuit of the amplification circuit. The phase adjustment value can be examined using the method of the present invention described later. The signal processing circuit is configured to calculate electrical conductivity of the liquid flowing through the cell using an amplified signal obtained by being amplified by the amplification circuit and the phase adjustment value which is for the gain used to obtain the amplified signal and is held in the phase adjustment value holding part.

In a preferred embodiment, the signal processing circuit is configured to adjust a phase of a reference signal multiplied by the amplification circuit obtained by the amplification circuit to determine the electric conductivity using the phase adjustment value for the gain used to obtain the amplified signal.

It is preferable that the electrical conductivity detector according to the present invention further includes a gain adjustment part configured to automatically adjust the gain of the amplification circuit according to a magnitude of the current flowing between the pair of electrodes. With this, the gain of the amplification circuit is automatically switched according to the magnitude of the current flowing between the pair of electrodes, so that a user can perform wide-range detection and high-resolution detection without manually adjusting the gain.

A method is provided for determining a phase adjustment value for canceling a phase difference between amplified signals obtained using gains of an amplification circuit of an electrical conductivity detector. The electrical conductivity detector comprises at least: a cell through which sample water flows; a pair of electrodes immersed in the sample water flowing through the cell; a voltage application part configured to apply a voltage between the pair of electrodes; the amplification circuit configured to amplify a current flowing between the pair of electrodes using any one of the gains to obtain the amplified signal; a signal processing circuit configured to calculate electrical conductivity of the sample water using the amplified signal obtained by the amplification circuit. The method includes, in the stated order:

a step of conducting between the pair of electrodes by a resistance having a resistance value with negligible capacitance;

a step of acquiring amplified signal waveforms for one cycle of the amplified signal, which is obtained by using each of the gains of the amplification circuit, of the current flowing between the pair of electrodes; and a step of determining a phase difference between each of the amplified signals, obtained by using each of the gains, and the reference signal, as a phase adjustment value for each of the gains, by calculating a difference between a time when the amplified signal reaches a maximum value in each of the amplified signal waveforms and a time when the reference signal reaches a maximum value in one cycle of a waveform of the reference signal or by calculating a difference between a time when the amplified signal reaches a minimum value in each of the amplified signal waveforms and a time when the reference signal reaches a minimum value in one cycle of the waveform of the reference signal.

Effects of the Invention

In the electrical conductivity detector according to the present invention, the electric conductivity of the sample liquid is determined using the phase adjustment value determined in advance for each of the gains for eliminating the phase difference between the amplified signals obtained using each of the gains of the amplification circuit together with the amplified signal obtained by amplification by the amplification circuit, so that the disturbance of the electrical conductivity waveform due to the switching of the gain of the amplification circuit is suppressed, and the electrical conductivity waveform in a continuous shape can be obtained.

According to the method of the present invention, the phase adjustment value used in the electrical conductivity detector can be acquired.

BRIEF DESCRIPTION OF THE DRAWINGS

FIG. 4 is a flowchart showing an example of a method for acquiring a phase difference adjustment value for each gain.

EMBODIMENTS OF THE INVENTION

In the following, one embodiment of each of an electrical conductivity detector and a method for acquiring a phase adjustment value used in the electrical conductivity detector according to the present invention will be described with reference to the drawings.

Figure 1:
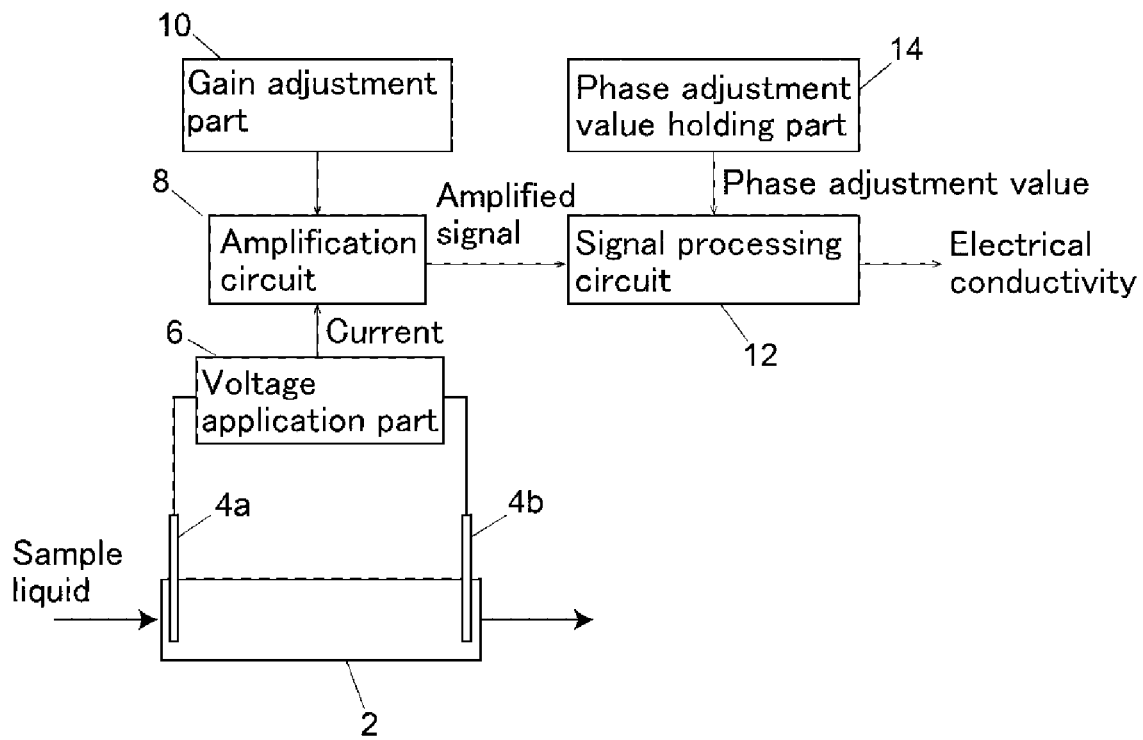
FIG. 1 is a configuration diagram schematically showing one embodiment of an electrical conductivity detector.

First, the configuration of one embodiment of the electrical conductivity detector will be described with reference to FIG. 1.

The electrical conductivity detector includes a cell 2, a pair of electrodes 4a and 4b, a voltage application part 6, an amplification circuit 8, a gain adjustment part 10, a signal processing circuit 12, and a phase adjustment value holding part 14.

A sample liquid flows through the cell 2, and the pair of electrodes 4a and 4b are immersed in the sample liquid flowing through the cell 2. The voltage application part 6 is configured to apply a predetermined voltage between the electrodes 4a and 4b. The amplification circuit 8 is configured to amplify a current flowing between the electrodes 4a and 4b when the predetermined voltage is applied by the voltage application part 6 to generate an amplified signal. The amplification circuit 8 has a plurality of gains, and amplifies the current flowing between the electrodes 4a and 4b using any one of the gains.

The gain adjustment part 10 is configured to associate the current level flowing between the electrodes 4a and 4b with the gain used to amplify the current in advance, read the magnitude of the current flowing between the electrodes 4a and 4b, and select a gain according to the size. As a result, when the electrical conductivity of the sample liquid flowing through the cell 2 exceeds a certain value, the gain of the amplification circuit 8 is automatically switched, and the amplification factor of the current is reduced. The gain adjustment part 10 is a function realized by hardware or software.

The amplified signal generated by the amplification circuit 8 is taken into the signal processing circuit 12. The signal processing circuit 12 is configured to determine the electrical conductivity of the sample water flowing through the cell 2 using the amplified signal from the amplification circuit 8. When determining the electrical conductivity using the amplified signal, the signal processing circuit 12 is configured to eliminate the influence due to the phase delay specific to the gain using the phase adjustment value for the gain used to generate the amplified signal. The phase adjustment value for each gain is held in the phase adjustment value holding part 14. The phase adjustment value holding part 14 is realized by a partial area of a storage device.

Figure 2:
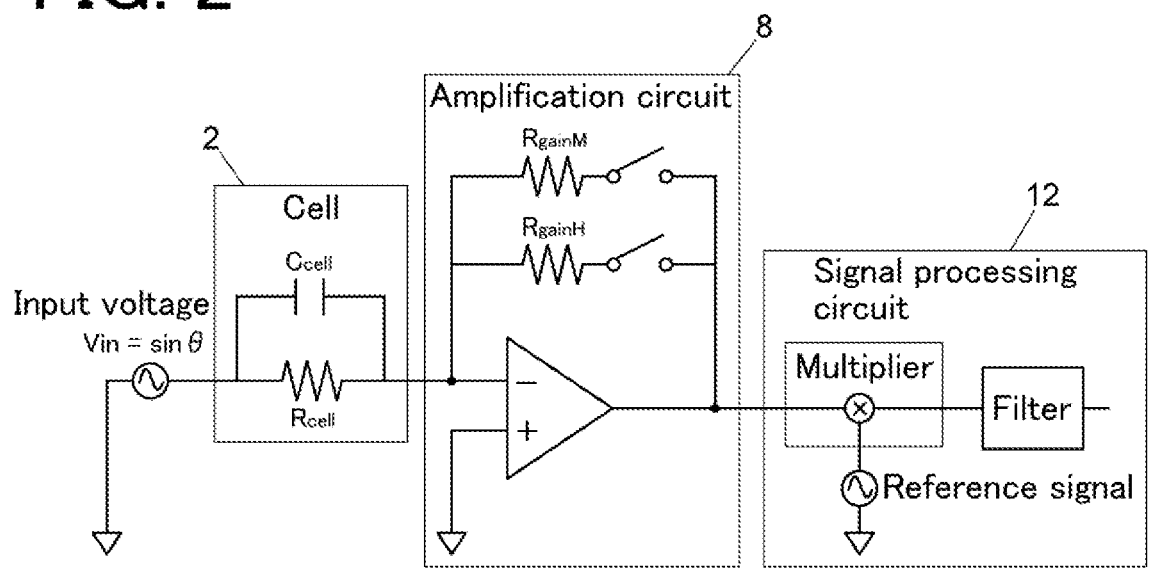
FIG. 2 is a principle diagram for explaining the principle of electrical conductivity measurement of the same embodiment.

The measurement principle of the electrical conductivity detector will be described with reference to FIG. 2. In the following description, the voltage (input voltage) $V_{in}$ applied between the electrodes 4a and 4b will be described as sin θ for convenience.

As shown in the figure, the cell 2 can be approximated by a parallel circuit of a capacitance $C_{cell}$ between the electrodes 4a and 4b and a resistance value $R_{cell}$. The capacitance $C_{cell}$ and the resistance value $R_{cell}$ between the electrodes 4a and 4b are variables whose values change depending on the electric conductivity of the sample liquid.

The amplification circuit 8 changes the gain by changing a resistance value of an operational amplifier. Here, the amplification circuit 8 is described as having two gains (high and medium) realized by two resistance values $R_{gainH}$ and $R_{gainM}$, but the amplification circuit 8 may have three or more gains. Amplified signals $S_{gainH}$ and $S_{gainM}$ obtained by amplifying the current flowing between the electrodes 4a and 4b using gains are expressed by Equations (1) and (2) below, respectively. In Equations (1) and (2), $\alpha_H$ and $\alpha_M$ are phase delay amounts generated in a circuit including each gain, and w is an angular frequency.

$$S_{gainH} = \left[\frac{1}{R_{cell}}\sin(\theta - \alpha_H) + \omega C_{cell}\cos(\theta - \alpha_H)\right] \times R_{gainH} \quad (1)$$

$$S_{gainM} = \left[\frac{1}{R_{cell}}\sin(\theta - \alpha_M) + \omega C_{cell}\cos(\theta - \alpha_M)\right] \times R_{gainM} \quad (2)$$

The signal processing circuit 12 includes a multiplier that multiplies the amplified signals $S_{gainH}$ and $S_{gainM}$ by a reference signal, and a filter that accumulates the multiplied value for one period. The reference signal is the same $\sin \theta$ as the input signal. The electrical conductivity detector of the embodiment is configured to adjust the phase of this reference signal using the phase adjustment value held in the phase adjustment value holding part 14, but here the description is continued as the reference signal being $\sin \theta$.

The values obtained by multiplying the amplified signals $S_{gainH}$ and $S_{gainM}$ by the reference signal $\sin \theta$, accumulating these for one period, and dividing the accumulated values by the resistance values $R_{gainH}$ and $R_{gainM}$ are expressed by Equations (3) and (4) below.

$$\int_0^{2\pi}\left[\frac{1}{R_{cell}}\sin(\theta - \alpha_H) + \omega C_{cell}\cos(\theta - \alpha_H)\right] \times \sin\theta = \quad (3)$$

$$\frac{\pi}{R_{cell}}\cos\alpha_H + \omega C_{cell}\pi\sin\alpha_H$$

$$\int_0^{2\pi}\left[\frac{1}{R_{cell}}\sin(\theta - \alpha_M) + \omega C_{cell}\cos(\theta - \alpha_M)\right] \times \sin\theta = \quad (4)$$

$$\frac{\pi}{R_{cell}}\cos\alpha_M + \omega C_{cell}\pi\sin\alpha_M$$

When Equations (3) and (4) above are divided by n, the electrical conductivities $G_H$ and $G_M$ are obtained. That is, $G_H$ and $G_M$ are expressed by Equations (5) and (6) below, respectively.

$$G_H = \frac{1}{R_{cell}}\cos\alpha_H + \omega C_{cell}\sin\alpha_H \quad (5)$$

$$G_M = \frac{1}{R_{cell}}\cos\alpha_M + \omega C_{cell}\sin\alpha_M \quad (6)$$

Figure 5A:
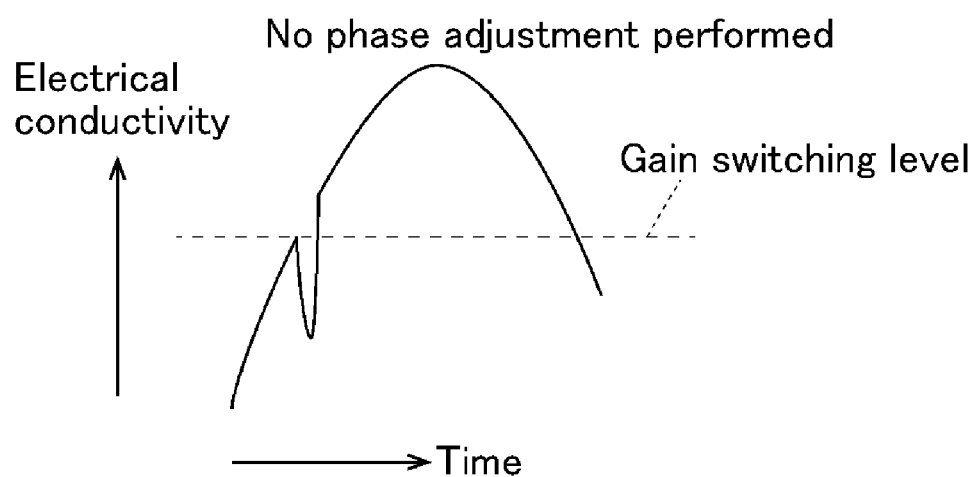
FIG. 5A is a diagram showing an example of an electrical conductivity waveform when a phase of a reference signal is not adjusted.

From Equations (5) and (6) above, it is found that the electrical conductivities $G_H$ and $G_M$ determined by calculation not only depend on $R_{cell}$ and $C_{cell}$, which vary depending on the actual electrical conductivity of the sample water, but also depend on the phase delay amounts $\alpha_H$ and $\alpha_M$ that occur in the respective circuits. Since the delay amounts $\alpha_H$ and $\alpha_M$ are values specific to the respective circuits including the gains, $\alpha_H \neq \alpha_M$. Therefore, $G_H \neq G_M$, and as shown in FIG. 5A, the waveform of the electric conductivity does not continue before and after the gain switching.

Here, since $\alpha_H$ and $\alpha_M$ are phase differences from the reference signal multiplied by the amplified signals $S_{gainH}$ and $S_{gainM}$, if the phase differences between the amplified signals $S_{gainH}$ and $S_{gainM}$ and the reference signal multiplied thereby are set to 0, that is, if the reference signals multiplied by the amplified signals $S_{gainH}$ and $S_{gainM}$ are respectively $\sin(\theta - \alpha_H)$ and $\sin(\theta - \alpha_M)$, $\alpha_H$ and $\alpha_M$ in Equations (5) and (6) above will be 0, respectively, and the equation below is satisfied.

$$G_H = G_M = \frac{1}{R_{cell}} \quad (7)$$

Figure 5B:
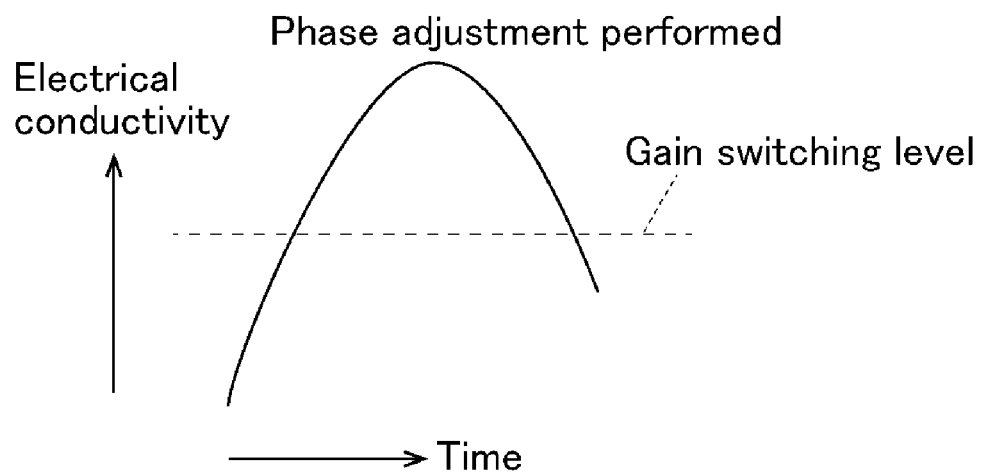
FIG. 5B is a diagram showing an example of an electrical conductivity waveform when the phase of the reference signal is adjusted.

Accordingly, as shown in FIG. 5B, the waveform of the electric conductivity continues before and after the gain of the amplification circuit 8 is switched. In the phase adjustment value holding part 14 (see FIG. 1), the phase delay amounts $\alpha_H$ and $\alpha_M$ generated in the circuits including the gains of the amplification circuit 8 are held as phase adjustment values.

A method for acquiring the phase adjustment values $\alpha_H$ and $\alpha_M$ will be described with reference to the principle diagram of FIG. 3 and the flowchart of FIG. 4.

Figure 3:
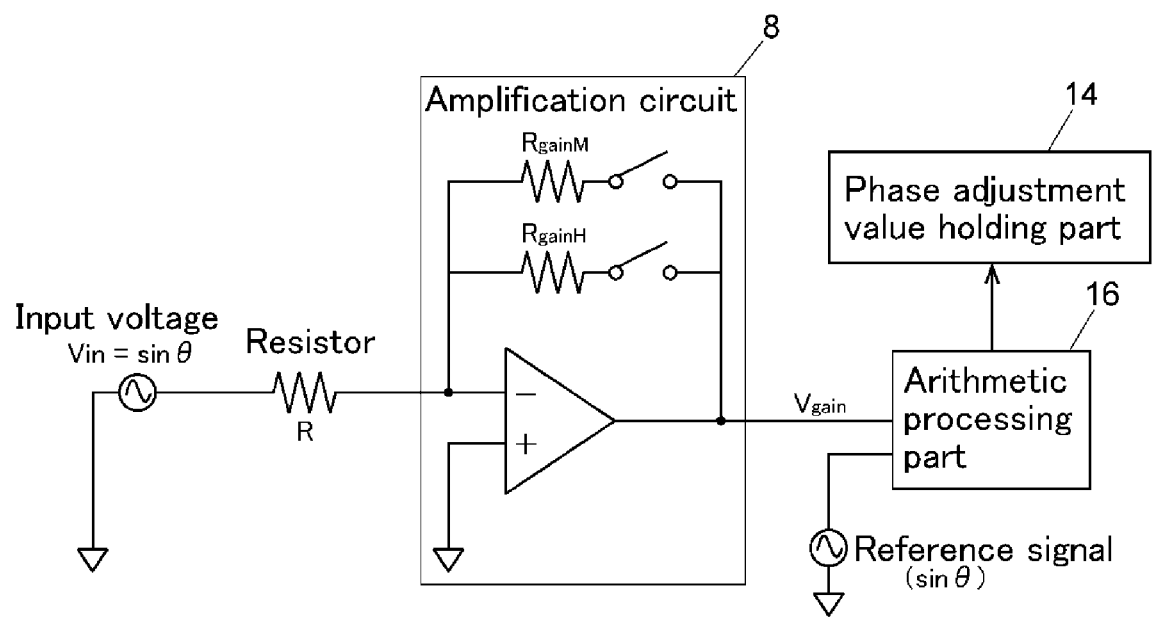
FIG. 3 is a principle diagram of a configuration for examining a phase difference adjustment value used in the electrical conductivity detector of the same embodiment.

When the phase adjustment values $\alpha_H$ and $\alpha_M$ are acquired, as shown in FIG. 3, in place of the cell 2, a resistor (resistance value R) small enough to ignore the capacitance is mounted between the electrodes 4a and 4b. (Step S1). In this state, any one gain of the amplification circuit 8 is selected (step S2), the amplified signals obtained by amplifying the current flowing through the resistor by being applied with the voltage $\sin \theta$ between the electrodes 4a and 4b using the gains and the reference $\sin \theta$ are read for one circle by an arithmetic processing part 16 realized by, for example, a CPU (step S3).

The amplified signals $S_{gainH}$ and $S_{gainM}$ obtained by amplifying the currents flowing through the electrodes 4a and 4b using the respective gains by the amplification circuit 8 are as follows.

$$S_{gainH} = \frac{1}{R}\sin(\theta - \alpha_H) \times R_{gainH} \quad (8)$$

$$S_{gainM} = \frac{1}{R}\sin(\theta - \alpha_M) \times R_{gainM} \quad (9)$$

The arithmetic processing part 16 determines the time at which the amplified signals and the reference signal $\sin \theta$ each have the maximum value (or the minimum value), and determines the phase differences $\alpha_H$, $\alpha_M$ between the amplified signals and the reference signal from the differences between them (Step S4). Then, the determined phase differences are stored in the phase adjustment value holding part 14 as phase adjustment values (step S5). By performing this operation for all the gains provided in the amplification circuit 8, the phase adjustment value for each gain can be determined.

DESCRIPTION OF REFERENCE SIGNS

2: Cell
4a, 4b: Electrode
6: Voltage application part
8: Amplification circuit
10: Gain adjustment part
12: Signal processing circuit
14: Phase adjustment value holding part

The invention claimed is:

1. An electrical conductivity detector comprising:
a cell through which a sample liquid flows;
a pair of electrodes immersed in the liquid flowing through the cell;
a voltage application part which applies a predetermined voltage between the pair of electrodes;
an amplification circuit having a plurality of gains and which amplifies a current flowing between the pair of electrodes using any one of the gains to obtain an amplified signal;
a phase adjustment value holding part which holds phase adjustment values determined in advance for each of the gains for canceling a phase difference between amplified signals obtained using each of the gains of the amplification circuit; and
a signal processing circuit which calculates electrical conductivity of the liquid flowing through the cell using an amplified signal obtained by being amplified by the amplification circuit and the phase adjustment value which is for the gain used to obtain the amplified signal and is held in the phase adjustment value holding part.

2. The electrical conductivity detector according to claim 1, wherein the phase adjustment value is a phase delay amount.

3. The electrical conductivity detector according to claim 1, wherein the signal processing circuit is adjusts a phase of a reference signal multiplied by the amplification circuit obtained by the amplification circuit to determine the electric conductivity using the phase adjustment value for the gain used to obtain the amplified signal.

4. The electrical conductivity detector according to claim 1, further comprising a gain adjustment part which automatically adjusts the gain of the amplification circuit according to a magnitude of the current flowing between the pair of electrodes.

5. The electrical conductivity detector according to claim 3, wherein electrical conductivity $G_H$ corresponding to a first gain is represented by Equation (5) below, electrical conductivity $G_M$ corresponding to a second gain is represented by Equation (6) below, a reference signal corresponding to the first gain is sin $(\delta - \alpha_H)$, and a reference signal corresponding to the second gain is sin $(\theta - \alpha_M)$, whereby αH and αM are each 0.

$$G_H = \frac{1}{R_{cell}} \cos\alpha_H + \omega C_{cell} \sin\alpha_H \quad (5)$$

$$G_M = \frac{1}{R_{cell}} \cos\alpha_M + \omega C_{cell} \sin\alpha_M \quad (6)$$

Here, $R_{cell}$ is a resistance value between the pair of electrodes, $C_{cell}$ is a capacitance between the pair of electrodes, $\alpha_H$ is a phase delay amount corresponding to the first gain, and am is a phase delay amount corresponding to the second gain.

6. The electrical conductivity detector according to claim 1, wherein
the plurality of gains are prepared so as to correspond to values of current flowing between the pair of electrodes,
the electrical conductivity detector further comprises a gain adjustment part which reads value of current flowing between the pair of electrodes, and selects gain corresponding to the value of current among the plurality of the gains,
the phase adjustment value holding part holds phase adjustment values determined in advance for each of the plurality of gains for canceling a phase difference between amplified signals obtained using each of the gains of the amplification circuit in a state where the phase adjustment values correspond to the plurality of gains respectively, and
the signal processing circuit makes a waveform of the electrical conductivity before and after a switching of the gain continuous by calculating the electrical conductivity using the amplified signal obtained by the amplification circuit and the phase adjustment value corresponding to the gain selected by the gain adjustment part.

7. A method for determining a phase adjustment value for canceling a phase difference between amplified signals obtained using each gain of an amplification circuit of an electrical conductivity detector, wherein
the electrical conductivity detector comprises at least: a cell through which sample water flows; a pair of electrodes immersed in the sample water flowing through the cell; a voltage application part which applies a voltage between the pair of electrodes; the amplification circuit amplifying a current flowing between the pair of electrodes using any one of the gains to obtain the amplified signal; and a signal processing circuit which calculates electrical conductivity of the sample water using the amplified signal obtained by the amplification circuit,
the method comprising, in the stated order:
a step of conducting between the pair of electrodes by a resistance having a resistance value with negligible capacitance;
a step of acquiring amplified signal waveforms for one cycle of the amplified signal, which is obtained by using each of the gains of the amplification circuit, of the current flowing between the pair of electrodes; and
a step of determining a phase difference between each of the amplified signals, obtained by using each of the gains, and the reference signal, as a phase adjustment value for each of the gains, by calculating a difference between a time when the amplified signal reaches a maximum value in each of the amplified signal waveforms and a time when the reference signal reaches a maximum value in one cycle of a waveform of the reference signal or by calculating a difference between a time when the amplified signal reaches a minimum value in each of the amplified signal waveforms and a time when the reference signal reaches a minimum value in one cycle of the waveform of the reference signal.

* * * * *